US012573522B2

(12) United States Patent
Lee et al.

(10) Patent No.: US 12,573,522 B2
(45) Date of Patent: Mar. 10, 2026

(54) THIN-FILM STRUCTURE AND SEMICONDUCTOR DEVICE COMPRISING THE SAME

(71) Applicant: Samsung Electronics Co., Ltd., Suwon-si (KR)

(72) Inventors: Sangjun Lee, Seoul (KR); Gabjin Nam, Seoul (KR); Eunha Lee, Seoul (KR); Hyangsook Lee, Suwon-si (KR); Bongjin Kuh, Suwon-si (KR); Junghwa Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 612 days.

(21) Appl. No.: 17/897,519

(22) Filed: Aug. 29, 2022

(65) Prior Publication Data

US 2023/0282389 A1 Sep. 7, 2023

(30) Foreign Application Priority Data

Mar. 7, 2022 (KR) ........................ 10-2022-0028964

(51) Int. Cl.
H10D 1/68 (2025.01)
H01B 3/10 (2006.01)
(Continued)

(52) U.S. Cl.
CPC ................. H01B 3/12 (2013.01); H01B 3/10 (2013.01); H10D 1/68 (2025.01);
(Continued)

(58) Field of Classification Search
CPC .......... H01B 3/12; H01B 3/10; H10D 64/689; H10D 64/691; H10D 62/121; H10D 62/80; H10D 1/684; H10D 64/68; H10D 30/0415; H10D 30/701; H10D 62/40–405; H10B 51/00–50
See application file for complete search history.

(56) References Cited

U.S. PATENT DOCUMENTS 11,121,139 B2 9/2021 Frank
2016/0049302 A1* 2/2016 Grass ................... H10D 64/689
257/369

(Continued)

FOREIGN PATENT DOCUMENTS

CN 106463513 A * 2/2017 ........ H01L 27/11507
JP 6661197 B2 3/2020
WO WO-2016-031986 A1 3/2016

OTHER PUBLICATIONS

Huan et al., "Pathways Towards Ferroelectricity in Hafnia," Phys. Rev. B. 90, 064111, Jul. 3, 2014.
(Continued)

*Primary Examiner* — Shahed Ahmed
(74) *Attorney, Agent, or Firm* — Harness, Dickey & Pierce, P.L.C.

(57) ABSTRACT

A thin-film structure and a semiconductor device including the same are provided. The thin-film structure includes: a base layer; and a dielectric layer on the base layer, the dielectric layer including crystals including a <11x> (0≤x≤1) crystal orientation in an out-of-plane direction of the base layer and having an orthorhombic crystal structure of an oIV phase (space group: Pmn21).

20 Claims, 16 Drawing Sheets oIV phase, {111} PREFERENTIAL GROWTH $P_{eff} \sim 45.9\ \mu C/cm^2$

PREFERENTIAL GROWTH ORIENTATION ⟨111⟩

$P_{[110]} \sim 56\ \mu C/cm^2$

CRYSTAL ORIENTATION

(51) Int. Cl.

| | |
|---|---|
| *H01B 3/12* | (2006.01) |
| *H10D 30/67* | (2025.01) |
| *H10D 64/68* | (2025.01) |
| *H10D 30/62* | (2025.01) |
| *H10D 30/68* | (2025.01) |

(52) U.S. Cl.

CPC ....... *H10D 30/6739* (2025.01); *H10D 64/689* (2025.01); *H10D 64/691* (2025.01); *H10D 30/62* (2025.01); *H10D 30/6735* (2025.01); *H10D 30/6757* (2025.01); *H10D 30/68* (2025.01)

(56) References Cited

U.S. PATENT DOCUMENTS

| | | | |
|---|---|---|---|
| 2019/0131420 A1 | 5/2019 | Lu et al. | |
| 2020/0020762 A1 | 1/2020 | Frank et al. | |
| 2021/0151445 A1* | 5/2021 | Wagner | H10D 64/689 |
| 2021/0193811 A1* | 6/2021 | Moon | H01L 21/02356 |
| 2021/0202508 A1* | 7/2021 | Jeon | H10D 1/68 |
| 2021/0265507 A1 | 8/2021 | Peng et al. | |

OTHER PUBLICATIONS

Qi et al., "Stabilization of competing ferroelectric phases of HfO2 under epitaxial strain," Phys. Rev. Lett. 125, 257603, Sep. 26, 2020.

Batra et al., "Factors Favoring Ferroelectricity in Hafnia: A First-Principles Computational Study" J. Phys. Chem. C 121, 4139, Feb. 2, 2017.

Il-kwon Oh, et al., "The effect of La2O3-incorporation in HfO2 dielectrics on Ge substrate by atomic layer deposition", Applied Surface Science 287, 349-354, Oct. 5, 2013.

Office Action issued Dec. 18, 2025 in Korean Application No. 10-2022-0028964.

* cited by examiner oⅢ phase $P_{\text{eff}} \sim 25.5 \ \mu C/cm^2$

CRYSTAL ORIENTATION $P_{[001]} \sim 51 \ \mu C/cm^2$ oⅢ phase, (111) PREFERENTIAL GROWTH $P_{\text{eff}} \sim 29.3 \, \mu C/cm^2$ (111) — PREFERENTIAL GROWTH ORIENTATION $P_{[001]} \sim 51 \, \mu C/cm^2$

CRYSTAL ORIENTATION oIV phase, (111) PREFERENTIAL GROWTH $P_{\text{eff}} \sim 45.9\ \mu C/cm^2$

PREFERENTIAL
GROWTH ORIENTATION     (111)

$P_{[110]} \sim 56\ \mu C/cm^2$

CRYSTAL ORIENTATION

THIN-FILM STRUCTURE AND SEMICONDUCTOR DEVICE COMPRISING THE SAME

CROSS-REFERENCE TO RELATED APPLICATION

This application is based on and claims priority under 35 U.S.C. § 119 to Korean Patent Application No. 10-2022-0028964, filed on Mar. 7, 2022, in the Korean Intellectual Property Office, the disclosure of which is incorporated by reference herein in its entirety.

BACKGROUND

1. Field

The present disclosure relates to a thin-film structure and a semiconductor device including the same.

2. Description of the Related Art

Ferroelectrics are materials having ferroelectricity that maintains a spontaneous polarization by alignment of the internal electric dipole moment even if an electric field is not being applied from the outside. In other words, ferroelectrics are materials in which polarization (or electric field) remains semi-permanently within the material even when applying a constant voltage and then bringing the voltage back to 0 V. Such ferroelectric characteristics have been applied to the semiconductor devices as research for improving the performance of the devices. For example, studies have been conducted to apply, to memory devices, a characteristic in which the polarization value of a ferroelectric substance exhibits hysteresis with respect to a voltage change.

In addition, studies have recently published on the possibility that ferroelectric substances may have negative capacitance in certain areas, and if such ferroelectric properties are applied to transistors, the subthreshold swing may fall below 60 mV/dec which is the theoretical limit of existing silicon-based transistors. For this reason, research is being conducted to utilize ferroelectric materials in low-power semiconductor devices.

SUMMARY

Provided are a thin-film structure having a high polarization value and a low polarization switching energy barrier, and a semiconductor device including the same.

However, the task to be solved is not limited to the disclosure.

Additional aspects will be set forth in part in the description which follows and, in part, will be apparent from the description, or may be learned by practice of the presented embodiments of the disclosure.

According to an aspect of an embodiment, a thin-film structure includes: a base layer; and a dielectric layer on the base layer, the dielectric layer including crystals including a <11x> (0≤x≤1) crystal orientation in an out-of-plane direction of the base layer and having an orthorhombic crystal structure of an oIV phase (space group: Pmn21).

In addition, the dielectric layer may include a ferroelectric material.

In addition, the dielectric layer may include at least one of a hafnium oxide or a hafnium-zirconium oxide.

In addition, the angle between the <11x> (0≤x≤1) crystal orientation and the out-of-plane direction may be 35° or less.

In addition, crystals including the <11x> (0≤x≤1) crystal orientation may constitute about 10% or more of all crystals in the dielectric layer.

In addition, crystals including the <11x> (0≤x≤1) crystal orientation may be dominant among all crystals in the dielectric layer.

In addition, crystals including a <111> crystal orientation may be dominant among all crystals in the dielectric layer.

In addition, the thickness of the dielectric layer may be about 0.1 nm or more and about 20 nm or less.

In addition, the thickness of the dielectric layer may be about 5 nm or less.

In addition, the dielectric layer may be doped with a dopant including at least one of Zr, La, Y, Gd, Si, or Al.

In addition, the effective polarization of the dielectric layer in the out-of-plane direction may be about 25 μC/cm² or more and about 50 μC/cm² or less.

Crystals including the <11x> (0≤x≤1) crystal orientation and the orthorhombic crystal structure of the oIV phase (space group: Pmn21) may be dominant among all crystals in the dielectric layer.

Meanwhile, a semiconductor device according to an embodiment includes the thin-film structure described above.

In addition, the semiconductor device may include a first electrode; a second electrode is spaced apart from the first electrode; and the dielectric layer between the first and second electrodes, wherein one of the first electrode or the second electrode may be a base layer.

In addition, the semiconductor device may further include a paraelectric layer between the first and second electrodes.

In addition, the paraelectric layer may be arranged between the dielectric layer and the base layer.

In addition, the paraelectric layer may include at least one of aluminum oxide (Al₂O₃), lanthanum oxide (La₂O₃), yttrium oxide (Y₂O₃), or silicon oxide (SiO₂).

In addition, at least one of the first electrode and the second electrode may include a semiconductor material.

In addition, the electrode including the semiconductor material may include a source and a drain.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 13 is a schematic diagram illustrating a capacitor according to at least one example embodiment;

DETAILED DESCRIPTION

Figure 1:
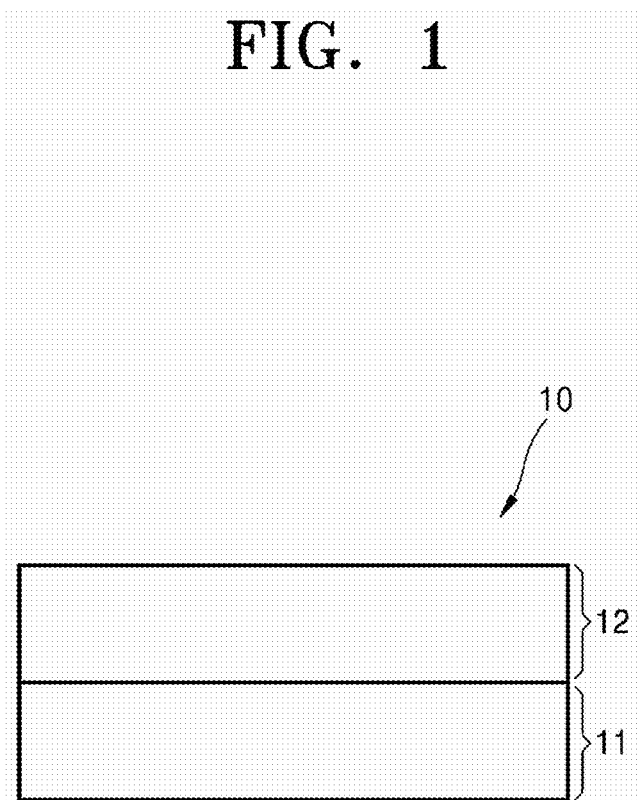
FIG. 1 is a view illustrating a thin-film structure according to at least one example embodiment.

Reference will now be made in detail to some embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the present disclosure are used only to describe specific embodiments and are not intended to limit technical ideas. Hereinafter, the term "upper portion" or "on" may also include "to be present on a top, bottom, left and right portion on a non-contact basis" as well as "to be in directly contact with a top, bottom, left and right portion on a direct contact basis".

The singular expression includes plural expressions unless the context clearly implies otherwise. It is to be understood that the terms "include" or "have" are intended to indicate features, numbers, steps, operations, elements, components, materials, or combinations thereof, described in the disclosure, unless specifically otherwise described, but do not preclude the presence or addition of one or more other features, numbers, steps, operations, elements, components, materials, or combinations thereof.

The terms "first," "second," "third," and the like can be used to describe various elements, but one element is used only for purposes of distinguishing from other elements, and the order, type, and the like of the elements are not limited. In addition, the term "unit," "means," "modules," "unit" and/or the like means a unit of comprehensive configuration that handles at least one function or operation, which may be implemented in hardware or software, or a combination of hardware and software.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

Hereinafter, example embodiments will be described in detail with reference to the accompanying drawings. In the following drawings, the same reference numerals refer to the same elements, and the size of each element in the drawings may be exaggerated for clarity and convenience of description. Meanwhile, the embodiments described below are merely examples and various modifications are possible from these embodiments.

According to an aspect, a thin-film structure including a ferroelectric material may be provided.

FIG. 1 is a view illustrating a thin-film structure 10 according to an embodiment. Referring to FIG. 1, a thin-film structure 10 includes: a base layer 11; and a dielectric layer 12 which is disposed on the base layer 11 and includes crystals in which the <11x> (0≤x≤1) crystal orientation is arranged in an out-of-plane direction of the base layer 11 while having an orthorhombic crystal structure of an oIV phase (space group: Pmn21).

The base layer 11 may include a semiconductor material. For example, the base layer 11 may include at least one of Si, Ge, SiGe, group III-V semiconductor materials, and/or the like, and may be modified and used in various forms such as a silicon on insulator (SOI).

The dielectric layer 12 may be formed by depositing an amorphous layer including a fluorite-based material (e.g., an oxide having a fluorite-like structure) on the base layer 11 and then heat-treating the same, to crystallize the fluorite-based material. As used herein a "fluorite-based" may or may not include fluorine and/or $CaF_2$, and may have a motif as $MX_2$ where, M is a metal, and X may be ions that are arranged interstitially. The motif of the fluorite-based material may have a face-centered cubic (FCC) structure. For example, the fluorite-based material may include at least one of hafnium oxide, zirconium oxide, and hafnium-zirconium oxide including crystalline structure similar to the FCC structure of fluorite.

The amorphous layer may include an amorphous phase and/or cubic (and/or pseudo-cubic) phases. The amorphous layer may, for example, include regions of the fluorite-based material in an amorphous base. The amorphous base may have a similar composition to the fluorite-based material, but may include different phase (or crystalline) structures and/or different ratios. The amorphous layer may be formed by a conventional method known in the art. For example, atomic layer deposition (ALD), chemical vapor deposition (CVD), physical vapor deposition (PVD), sputtering, and/or the like may be used. Among them, the atomic layer deposition (ALD) method has the advantage of forming a uniform layer in units of atoms and being performed at a relatively low temperature.

Conventional precursors may be used as the hafnium source, the zirconium source, and/or the oxygen source when forming the amorphous layer through the atomic layer deposition (ALD) method. For example, the hafnium source may employ at least one of $Hf(OtBu)_4$, Tetrakis Ethyl Methyl Amino Hafnium (TEMAH), Tetrakis Di-Ethyl Amino Hafnium (TDEAH), and/or a combination thereof, but is not limited thereto. Further, the zirconium source may employ at least one from the group consisting of $Zr(OtBu)_4$, Tetrakis Ethyl Methyl Amino Zirconium (TEMAZ), Tetrakis Di-ethyl Amino Zirconium (TDEAZ), and/or a combination thereof, but is not limited thereto. In addition, the oxygen source may employ at least one of $O_3$, $H_2O$, $O_2$, $N_2O$, $O_2$ plasma, and/or combinations thereof, but is not limited thereto.

A thermal budget by heat treatment may be determined in consideration of a composition, a thickness, and/or the like of a fluoride-based amorphous layer. The heat treatment may be performed at a temperature of about 150° C. or greater to about 1100° C. or less, and rapid thermal processing (RTP), laser annealing, etc., which can ramp up/ramp down at a fast rate, may be applied. The heat treatment may be performed for one nano-second or longer, one micro-second or longer, 0.001 seconds or longer, 0.01 seconds or longer, 0.05 seconds or longer, 0.1 seconds or longer, 0.5 seconds or longer, one second or longer, three seconds or longer, and/or five seconds or longer, and/or for 10 minutes or shorter, five minutes or shorter, one minute or shorter, and/or 30 seconds or shorter, but is not limited thereto. The atmosphere in which thermal treatment is carried out is not particularly limited.

The crystalline phase of the crystallized fluoride-based material may vary depending on the thickness of the amorphous layer, the heat treatment method, and/or the like. For example, when an amorphous layer including the fluoride-based material having a thickness of about 3 nm is deposited on the base layer 11 and then the laser heat-treatment is carried out thereon, amorphous layer including the fluoride-based material may be crystallized into an orthorhombic crystal structure of an oIII phase (Pca21 space group). Meanwhile, when an amorphous layer including the fluoride-based material having a thickness of about 1.5 nm is deposited on the base layer 11 and then subjected to laser heat treatment, the amorphous layer including the fluoride-based material may be crystallized into an orthorhombic crystal structure of an oIV phase (Pmn21 space group) while being preferentially grown such that the <11x> (0≤x≤1) crystal orientation is arranged in the out-of-plane direction of the base layer 11.

Meanwhile, the crystal orientation of the orthorhombic crystal structure of the oIII phase (Pca21 space group) may be arranged in a random orientation and/or a specific orientation.

Figure 2:
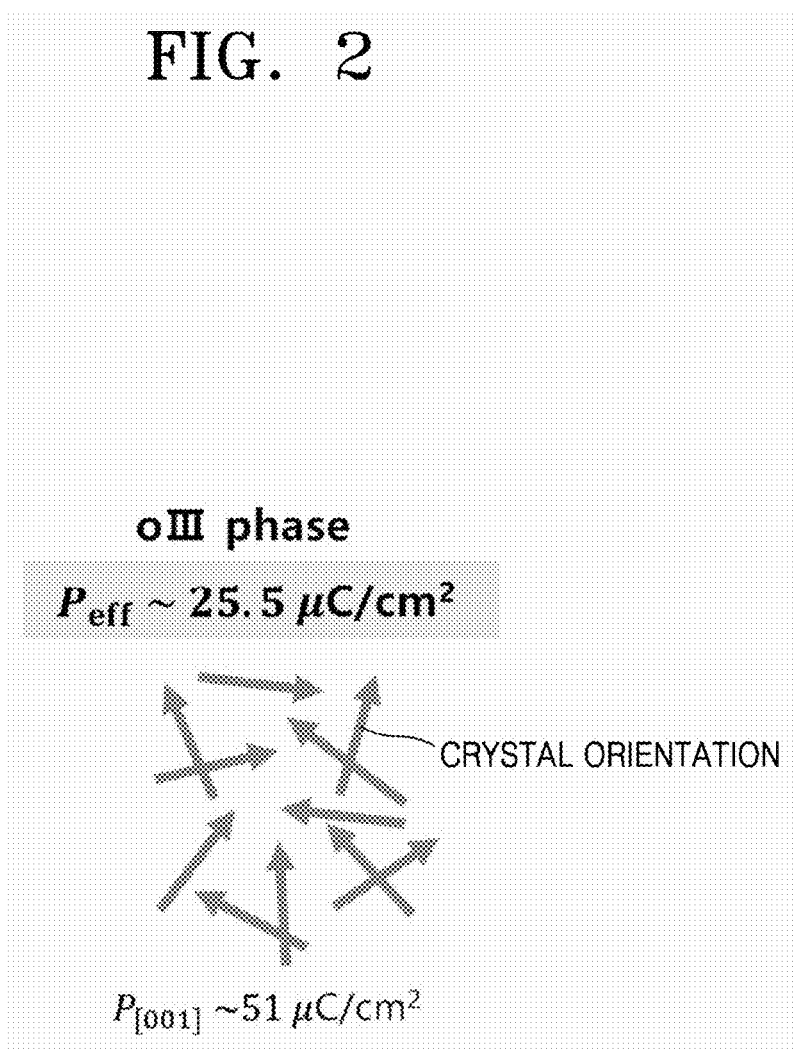
FIG. 2 is a schematic view illustrating a crystal orientation of hafnium oxide (HfO₂) having an orthorhombic crystal structure of an oIII phase.

FIG. 2 is a schematic view illustrating a crystal orientation of a hafnium oxide ($HfO_2$) having an orthorhombic crystal structure of an oIII phase. As illustrated in FIG. 2, the growth orientation of the hafnium oxide may be a random orientation. A crystal orientation having the largest polarization value of hafnium oxide ($HfO_2$) with an orthorhombic crystal structure of an oIII phase is (001), and a size thereof is about 51 μC/cm². Since the crystals forming the dielectric layer 12 have grown in a random orientation without a distinct orientation, The effective polarization ($P_{eff}$) of the base layer 11 in the out-of-plane direction may be about 25.5 μC/cm², which is about 50% with respect to the polarization value in the crystal orientation (001).

Figure 3:
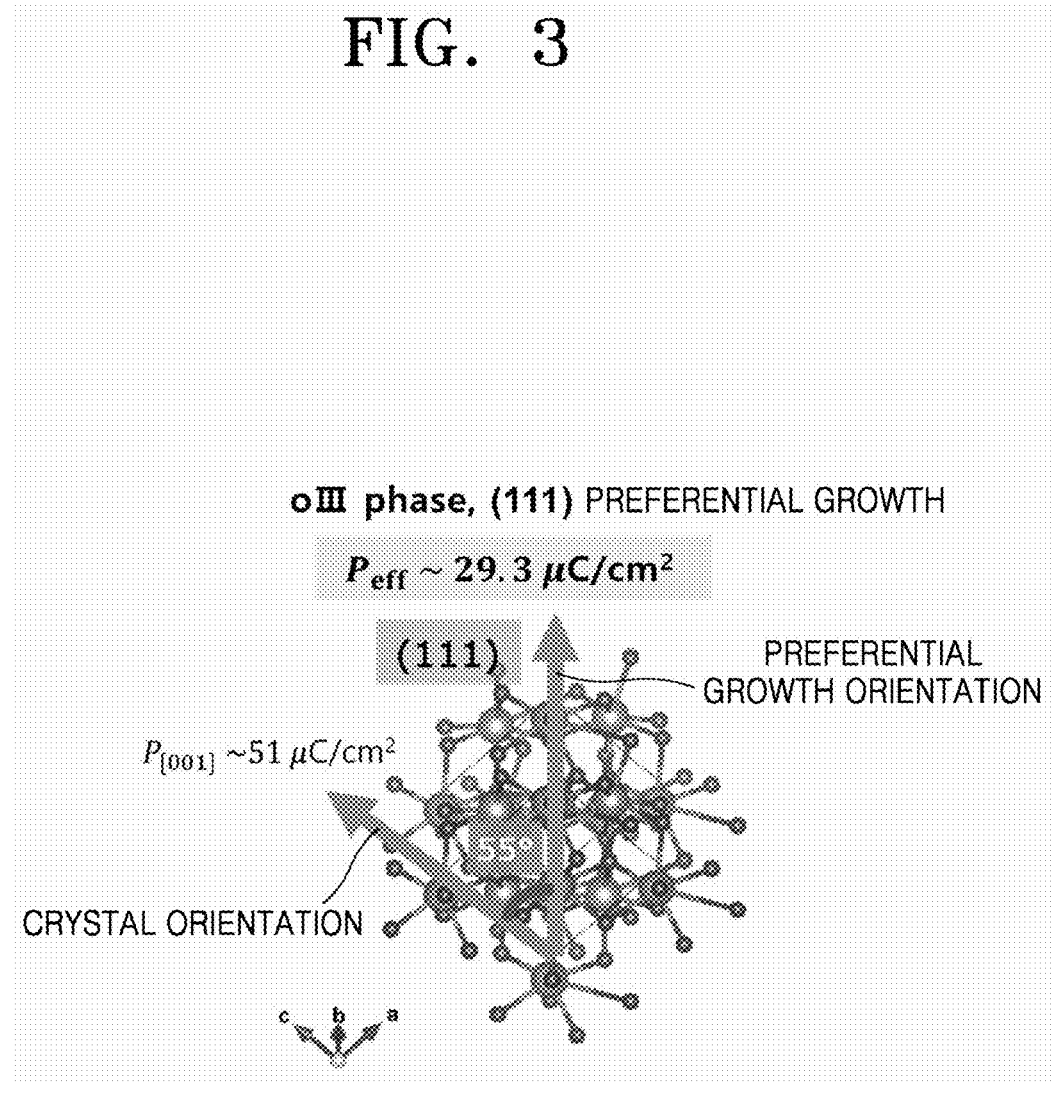
FIG. 3 is a schematic view illustrating a crystal orientation of hafnium oxide (HfO₂) having an orthorhombic crystal structure of an oIII phase, which is preferentially grown in a specific orientation.

FIG. 3 is a schematic view illustrating a crystal orientation of a hafnium oxide ($HfO_2$) having an orthorhombic crystal structure of an oIII phase, which is first grown in a specific direction. As shown in FIG. 3, the hafnium oxide may have a preferred-growth direction such that the <111> crystal orientation is arranged in an out-of-plane direction. The crystal orientation having the largest polarization value of hafnium oxide ($HfO_2$) with an orthorhombic crystal structure of an oIII phase is (001), and the size thereof is about 51 μC/cm². The angle between the crystal orientation (001) and the growth orientation (or out-of-plane direction) is about 55°, and the effective polarization ($P_{eff}$) in the out-of-plane direction may be about 29.3 μC/cm².

It may be confirmed that the effective polarization of the hafnium oxide which is preferentially grown in a specific orientation is greater than that of the hafnium oxide grown in a random orientation. However, the effective polarization of hafnium oxide having an orthorhombic crystal structure of an oIII phase is still lower than 30 μC/cm². In addition, since the polarization switching energy barrier of hafnium oxide with an orthorhombic crystal structure of an oIII phase is high at about 40 meV, a high operating voltage is required.

Figure 4:
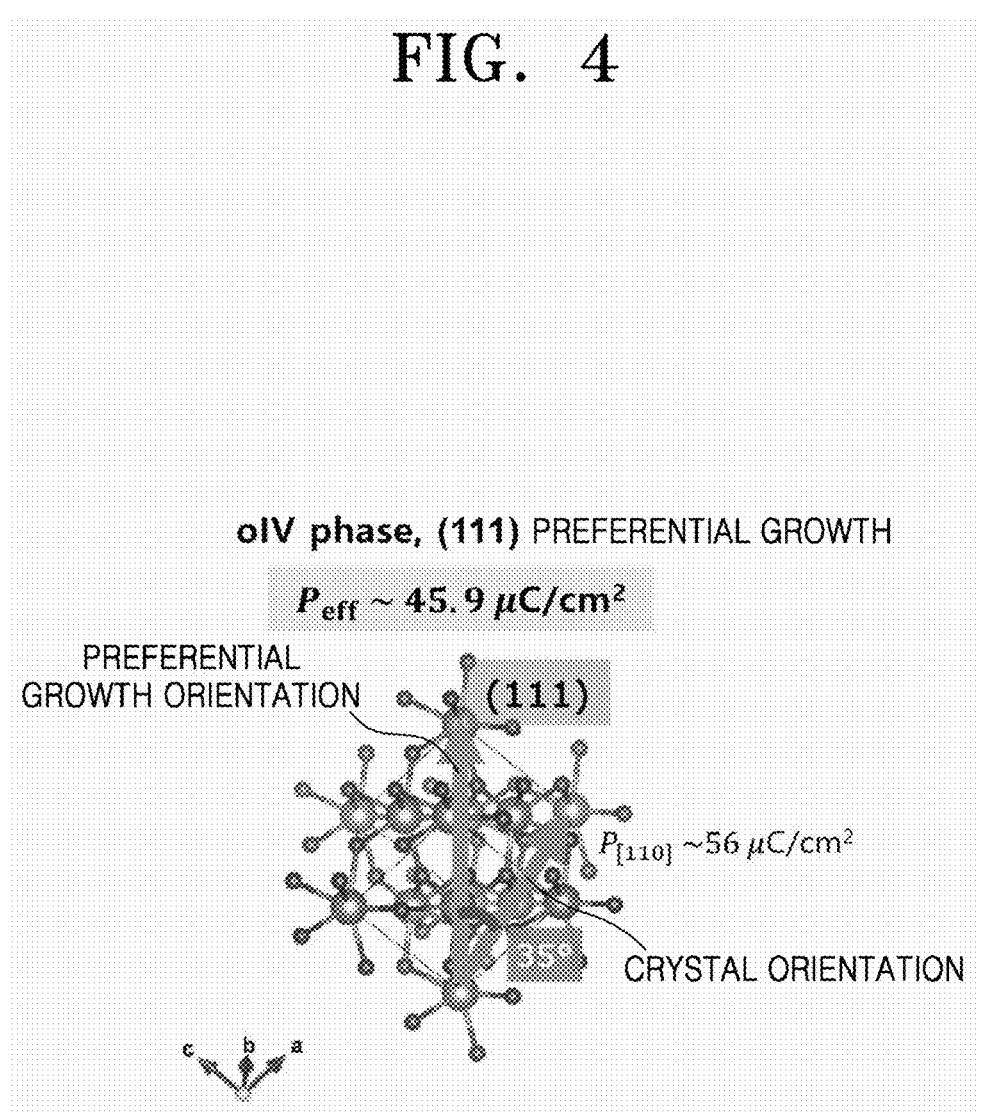
FIG. 4 is a schematic view illustrating a crystal orientation of hafnium oxide (HfO₂) having an orthorhombic crystal structure of an oIV phase, which is preferentially grown in a specific orientation.

FIG. 4 is a schematic view illustrating a crystal orientation of a hafnium oxide ($HfO_2$) having an orthorhombic crystal structure of an oIV phase, which is preferentially grown in a specific orientation. As shown in FIG. 4, the hafnium oxide may have a preferred-growth orientation such that the <111> crystal orientation is arranged in an out-of-plane direction. The crystal orientation having the largest polarization value of hafnium oxide ($HfO_2$) with an orthorhombic crystal structure of an oIV phase is (110), and the size thereof is about 56 μC/cm². The angle between the <111> crystal orientation and the out-of-plane direction (or the growth orientation) is about 35°, and the effective polarization ($P_{eff}$) in the out-of-plane direction has been increased largely at about 45.9 μC/cm².

It can be seen that the hafnium oxide having a first growth direction has an orthorhombic crystal structure of an oIV phase and has a preferred-growth orientation so that the <111> crystal orientation may be arranged in the out-of-plane direction, has the effective polarization increased by about 80% or more compared to the hafnium oxide having an orthorhombic crystal structure of an oIII phase and having grown in a random orientation.

In addition, a polarization switching energy barrier of the hafnium oxide having an orthorhombic crystal structure of an oIV phase is about 8 meV, which is about 0.2 times lower than that of the hafnium oxide having an orthorhombic crystal structure of an oIII phase.

Accordingly, the dielectric layer including crystals in which the <11x> (0≤x≤1) crystal direction is arranged in the out-of-plane direction while having an orthorhombic crystal structure of an oIV phase (space group Pmn21) may have high polarization characteristics and low polarization switching energy barrier.

Figure 5:
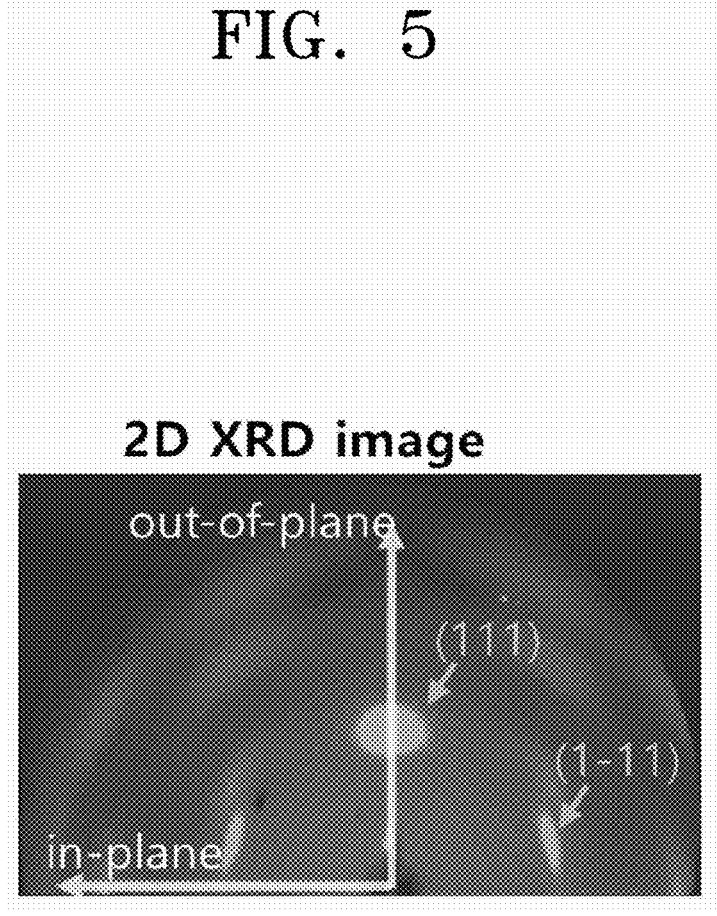
FIG. 5 is an X-ray diffraction (XRD) pattern of hafnium oxide crystallized by laser annealing at about 1000° C., after growing on a base layer, amorphous hafnium oxide having a thickness of about 1.5 nm.
Figure 6:
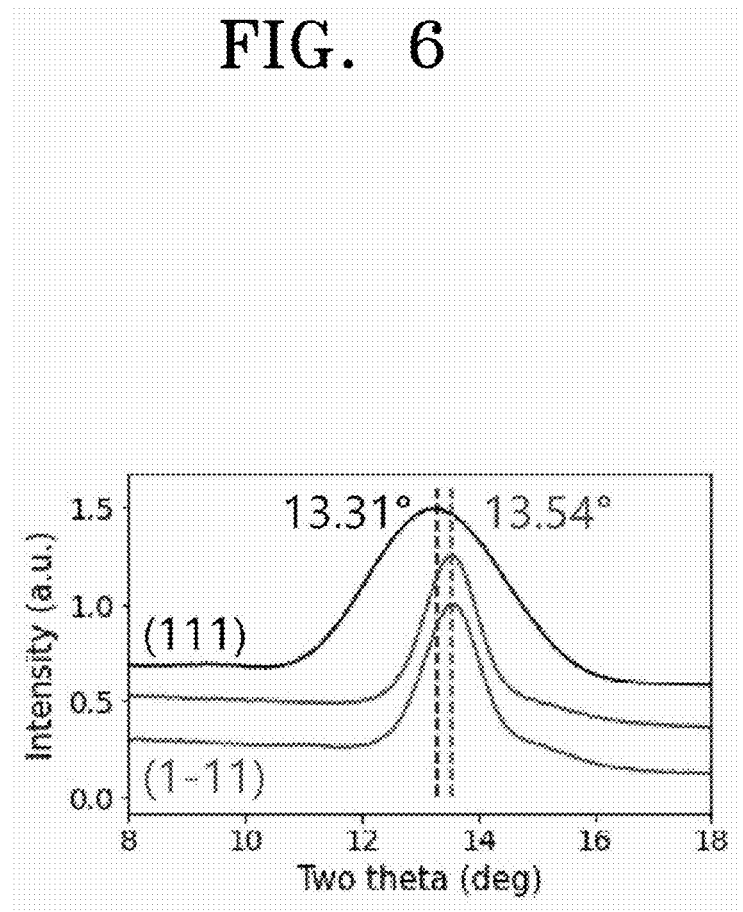
FIG. 6 is a 2D X-ray diffraction (XRD) image of the hafnium oxide of FIG. 5.

FIG. 5 is an X-ray diffraction (XRD) pattern of the hafnium oxide crystallized by laser annealing at about 1000° C., after growing on the base layer 11, an amorphous hafnium oxide having a thickness of about 1.5 nm, and FIG. 6 is a 2D X-ray diffraction (XRD) image of the hafnium oxide of FIG. 5.

Referring to FIG. 5, it may be confirmed that the peak of the (111) plane and the peak of the (1-11) plane are at different positions. The peak of the (1-11) plane is located at an angle higher than the peak of the (111) plane. The fact that the peaks of (111) plane and the peaks of (1-11) plane are at different positions means that the crystallized hafnium oxide has an oIV phase.

Referring to FIG. 6, it may be seen in an XRD image that the crystals in the <111> crystal orientation are arranged in an out-of-plane direction. This means that the preferential growth direction of the hafnium oxide is the same as the <111> crystal orientation.

Figure 7:
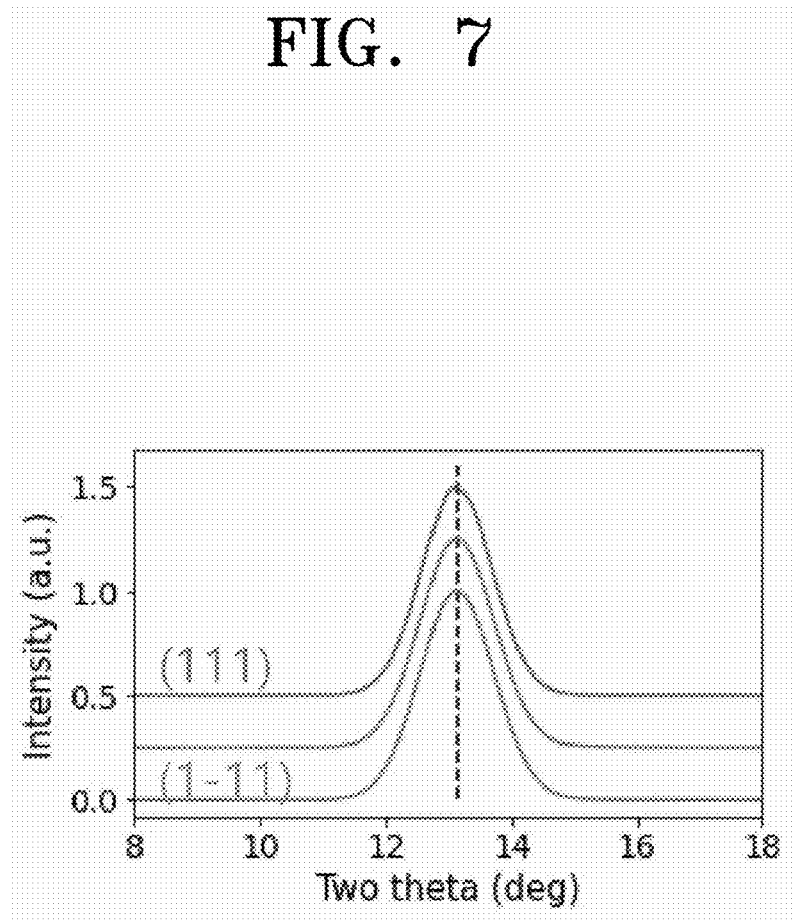
FIG. 7 is an X-ray diffraction (XRD) pattern of hafnium oxide crystallized by laser annealing at about 1000° C., after growing on a base layer, amorphous hafnium oxide having a thickness of about 3 nm.

FIG. 7 is an X-ray diffraction (XRD) pattern of the hafnium oxide crystallized by laser annealing at about 1000° C., after growing on the base layer, an amorphous hafnium oxide having a thickness of about 3 nm. Referring to FIG. 7, it may be confirmed that the peak of the (111) plane and the peak of the (1-11) plane are at the same position. The fact that the peaks of (111) plane and the peaks of the (1-11) plane are at the same position means that the crystallized hafnium oxide has an oIII phase. In order to obtain a hafnium oxide of an oIII phase, an amorphous hafnium oxide should be deposited to a thickness of less than 3 nm and then heat-treated.

The preferential growth orientation of the hafnium oxide is not limited to an orientation in which the <111> crystal orientation is arranged in an out-of-plane direction. The preferential growth orientation of the hafnium oxide may be an orientation in which the <11x> (0≤x≤1) crystal orientation is arranged in an out-of-plane direction. The angle between the <111> crystal orientation and the out-of-plane direction (or the growth orientation) is about 35°, and the effective polarization (Pelf) in the out-of-plane direction has been increased largely at about 45.9 $\mu C/cm^2$. An angle between the <11x> (0≤x≤1) crystal orientation and the out-of-plane direction may be about 35° or less. Since the <110> crystal orientation has the largest polarization value, the effective polarization may be further increased when the <11x> (0≤x≤1) crystal orientation is arranged in the out-of-plane direction.

According to at least one example embodiment, the thin-film structure including the dielectric layer 12 disposed on the base layer 11 and including crystals in which the <11x> (0≤x≤1) crystal orientation is arranged in the out-of-plane direction of the base layer 11 while having an ortho-rhombic crystal structure of an oIV phase may have high effective polarization. The effective polarization in the out-of-plane direction of the dielectric layer 12 may be about 25 $\mu C/cm^2$ or more, 30 $\mu C/cm^2$ or more, and/or 35 $\mu C/cm^2$ or more, and/or 55 $\mu C/cm^2$ or less, 50 $\mu C/cm^2$ or less, and/or 40 $\mu C/cm^2$ or less.

The crystals in which the <11x> (0≤x≤1) crystal orientation is arranged in the out-of-plane orientation of the base layer 11 may have a dominant ratio from among the entire crystals of the dielectric layer 12. For example, crystals in which <11x> (0≤x≤1) crystal orientation is arranged may be about 10% or more, 20% or more, 30% or more, 40% or more, and/or 45% or more, and/or 90% or less, 85% or less, 80% or less, 75% or less, 70% or less, 65% or less, 60% or 55% or less from among all the crystals in the dielectric layer 12.

The dielectric layer 12 may include hafnium-zirconium oxide in addition to hafnium oxide. Alternatively, the dielectric layer 12 may include a material represented by $MO_2X\delta$ (where M is Hf and/or Zr, X is O, N, and/or H, and 0≤δ≤1). Alternatively, the dielectric layer 12 may include, as a base material, a material represented by $MO_2X\delta$ (where M is Hf and/or Zr, X is O, N, and/or H, and 0≤δ≤1), and may further include a dopant including at least one of Zr, La, Y, Gd, Si, Al, and/or a combination thereof. The dopant material content may be more than 0 at %, 0.2 at % or more, 0.5 at % or more, 1 at % or more, 2 at % or more, and/or 3 at % or more, and/or 20 at % or less, 15 at % or less, 12 at % or less, 10 at % or less, 8 at % or less, 7 or less, and/or 6 at % or less, based on the metal element of the base material. The metal oxide may exhibit ferroelectricity even in a thin-film and may be applied to a conventional silicon-based semi-conductor device process to have high productivity.

The dielectric layer 12 may include an orthorhombic crystal structure of an oIV phase. The dielectric layer 12 may include various crystal structures such as an orthorhombic crystal structure and a tetragonal crystal structure, and may include an oI phase, an oII phase, an oIII phase, and/or the like among the orthorhombic crystal structures. However, in at least one embodiment, the dielectric layer 12 may include the orthorhombic crystal structure of the oIV phase as a dominant ratio (the largest ratio or the highest ratio of all crystal phases). The distribution of the crystal structure may be confirmed by a method known in the art, and for example, Transmission Electron Microscopy (TEM), Grazing Inci-dence X-ray Diffraction (GIXRD), and/or the like may be used.

The thickness of the dielectric layer 12 may be 0.1 nm or more, 1 nm or more, 1.5 nm or more, 2 nm or more, 3 nm or more, and/or 4 nm or more, 20 nm or less, and/or 15 nm or less, 10 nm or less, and/or 5 nm or less. The thickness of the dielectric layer 12 is grown thin and then heat-treated to obtain an orthorhombic crystal structure of an oIV phase. For example, the dielectric layer 12 including a plurality of layers may be formed by (a) growing an amorphous fluo-ride-based material of 2 nm or less on the base layer 11, (b) thermally treating the amorphous fluoride-based material so as to be crystallized and repeating the operations (a) and (b).

According to another aspect, a semiconductor device including the thin-film structure described above may be provided. The semiconductor device may be a memory device or a non-memory device, for example, a field effect transistor, a capacitor, and/or a combination structure thereof, but is not limited thereto.

Figure 8:
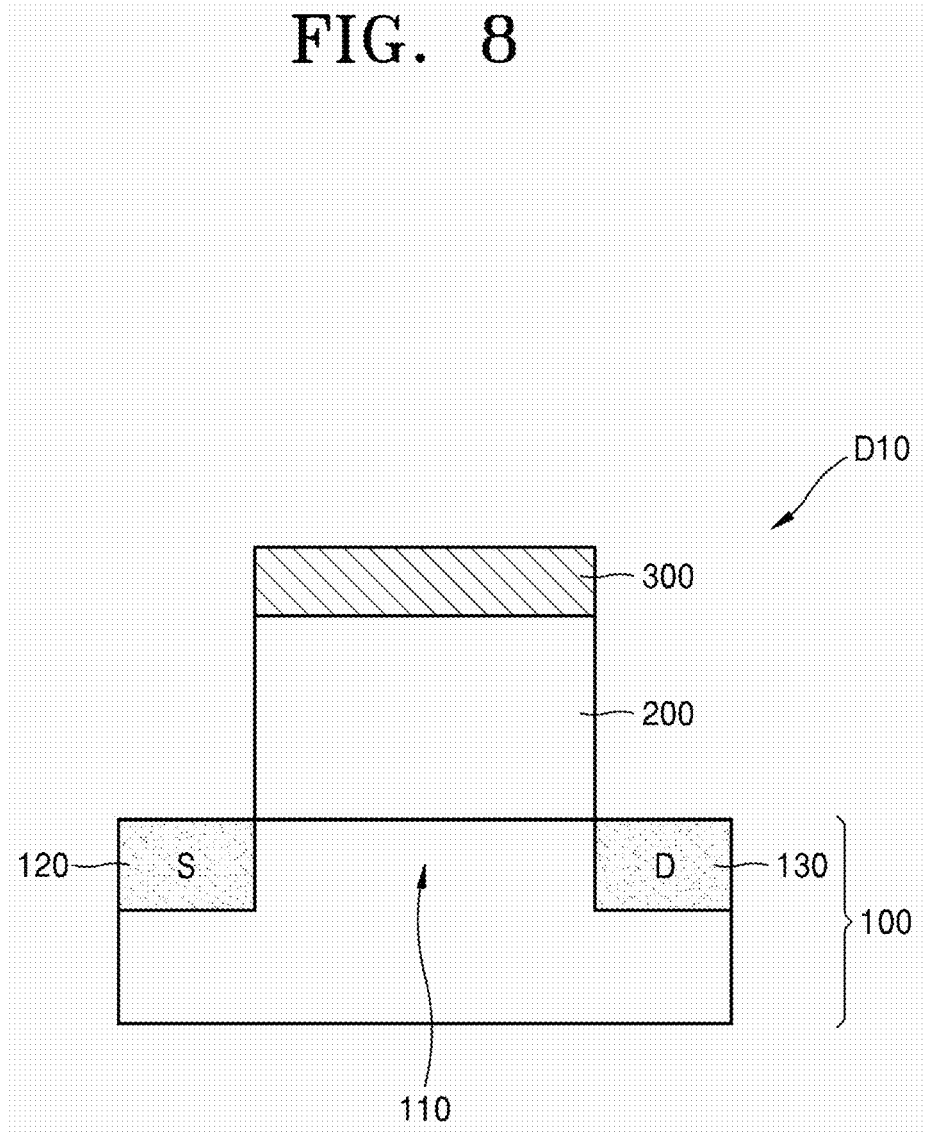
FIG. 8 is a schematic diagram illustrating a field-effect transistor (FET) according to at least one example embodiment.
Figure 9:
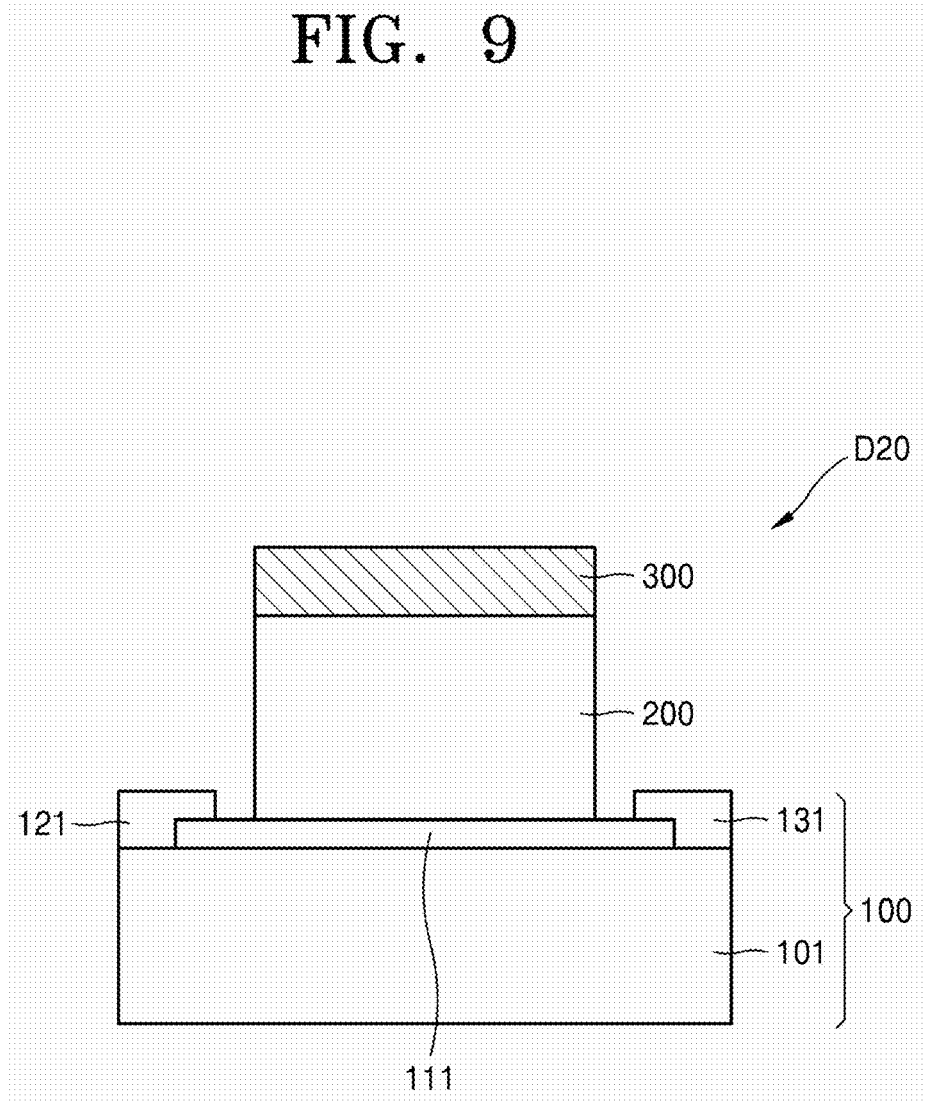
FIG. 9 is a schematic diagram illustrating a FET according to at least one example embodiment.

FIGS. 8 and 9 are schematic diagrams illustrating a field effect transistor according to some example embodiments. Referring to FIG. 8, the field effect transistor D10 includes: a substrate 100 including a source 120 and a drain 130; a gate electrode 300 disposed above the substrate 100; and a dielectric layer 200 arranged between the substrate 100 and the gate electrode 300. The dielectric layer 200 including crystals in which the <11x> (0≤x≤1) crystal orientation is arranged in the out-of-plane direction of the substrate 100 while having an orthorhombic crystal structure of an oIV phase (space group Pmn21) as discussed above. Referring to FIG. 9, the field effect transistor D20 includes: a substrate 100 including a source 121 and a drain 131; a gate electrode 300 disposed above the substrate 100; and a dielectric layer 200 arranged between the substrate 100 and the gate elec-trode 300, and including crystals in which the <11x> (0≤x≤1) crystal orientation is arranged in the out-of-plane direction of the substrate 100 while having an orthorhombic crystal structure of an oIV phase (space group: Pmn21) The field effect transistor may be a logic switching device. The logic switching device is a concept in contrast to a memory device (a memory transistor), may have non-memory char-acteristics, and may be a switching device for ON/OFF for non-memory.

The substrate 100 may include a semiconductor material. For example, the substrate 100 may include at least one of Si, Ge, SiGe, groups III-V semiconductor materials, and/or the like, and may be modified and used in various forms such as a silicon on insulator (SOI).

Referring to FIG. 8, the substrate 100 may include the source 120 and the drain 130, and may include a channel 110 electrically connected to the source 120 and the drain 130, and referring to FIG. 9, the substrate 100 may include the source 121 and the drain 131, and may include a channel 111 electrically connected to the source 121 and the drain 131). Referring to FIG. 8, the source 120 may be electrically connected to or in contact with one end of the channel 110, and the drain 130 may be electrically connected or in contact with the other end of the channel 110. Referring to FIG. 9, the source 121 may be electrically connected to or in contact with one end of the channel 111, and the drain 131 may be electrically connected or in contact with the other end of the channel 111.

Referring to FIG. 8, the channel 110 may be defined as a region between the source 120 and the drain 130 in the substrate 100. The source 120 and the drain 130 may be formed by injecting impurities into different regions of the substrate 100, and in this case, the source 120, the channel 110, and the drain 130 may include a substrate material as a base material.

In addition, referring to FIG. 9, the channel 111 may be implemented as a separate material layer (thin-film) from the substrate region 101. The material composition of the channel 111 may be various. For example, the channel 111 may include at least one of an oxide semiconductor, a nitride semiconductor, an oxynitride semiconductor, a two-dimensional (2D) material, a quantum dot, an organic semiconductor, and/or combinations thereof, as well as semiconductor materials such as Si, Ge, SiGe, groups III-V elements, etc. For example, the oxide semiconductor may include InGaZnO, and the two-dimensional material may include a transition metal dichalcogenide (TMD) and/or a graphene, and the quantum dot may include a colloidal quantum dot (colloidal QD), a nanocrystal structure, and/or the like. Furthermore, the source (121) and the drain (131) may be formed of a conductive material, for example, may each independently include a metal, a metal compound, or a conductive polymer.

The gate electrode 300 may be arranged above the substrate 100 to be spaced apart from the substrate 100 and may be arranged to face the channels 110 and 111. The gate electrode 300 may have a conductivity of, for example, about 1 Mohm/square or less. The gate electrode 300 may include at least one of a metal, a conductive metal oxide, a conductive metal nitride, a conductive metal carbide, poly-silicon, and/or a combination thereof. For example, the metal may include at least one of aluminum (Al), tungsten (W), molybdenum (Mo), titanium (Ti), tantalum (Ta) and/or the like, the conductive metal nitride may include at least one of a titanium nitride (TiN) film and/or a tantalum nitride (TaN) film, and the conductive metal carbide may include at least one of aluminum and/or silicon-doped (or -contained) metal carbide (and may include, e.g., TiAlC, TaAlC, TiSiC, and/or TaSiC). The gate electrode 300 may have a structure in which a plurality of materials are stacked. For example, the gate electrode 300 may have a stacked structure of a metal nitride layer/metal layer such as TiN/Al or a stacked structure of a metal nitride layer/metal carbide layer/metal layer such as TiN/TiAlC/W. The gate electrode 300 may include a titanium nitride film (TiN) or molybdenum (Mo), and the above examples may be variously modified.

The dielectric layer 200 may be arranged between the substrate 100 and the gate electrode 300. In some example embodiments, the dielectric layer 200 may be formed on each of the channels 110 and 111. The dielectric layer 200 may refer to the above-described feature.

Figure 10:
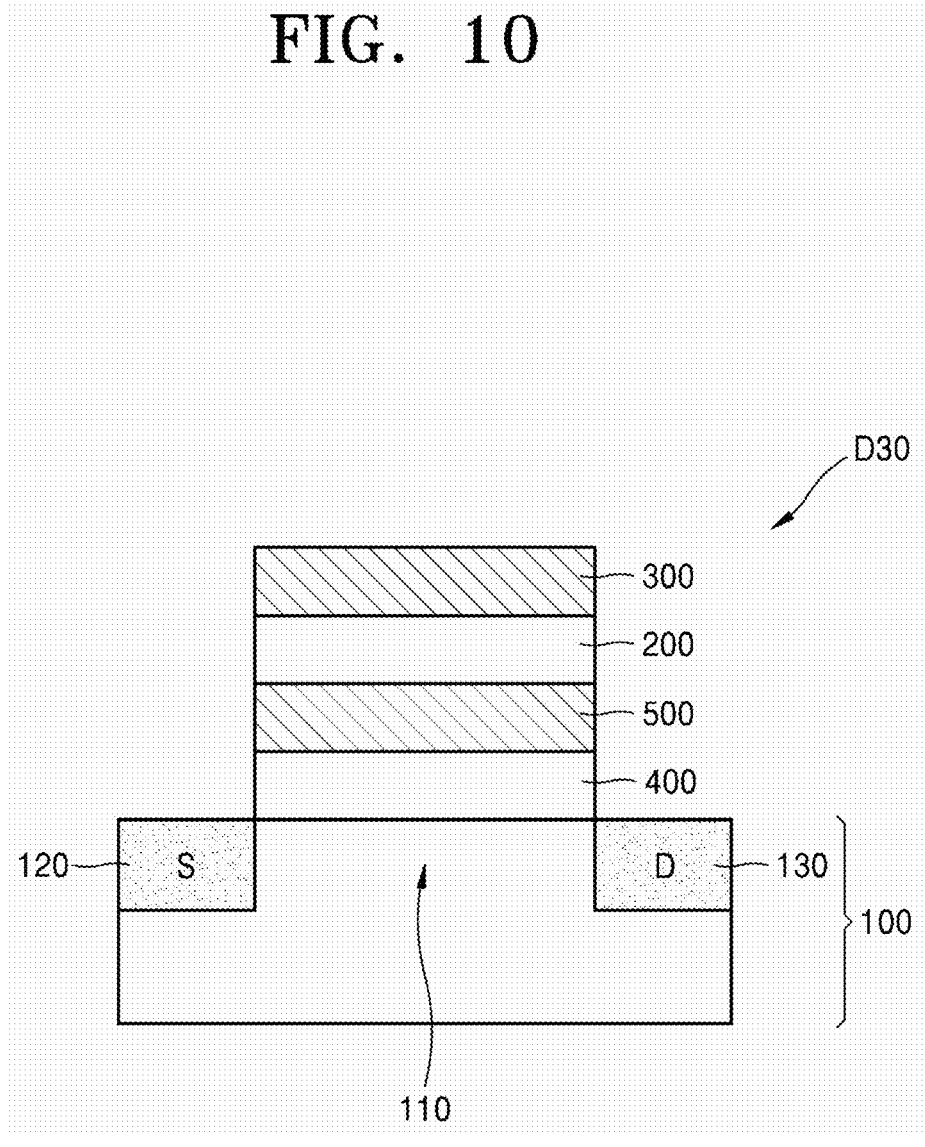
FIG. 10 is a schematic diagram illustrating a FET according to at least one example embodiment.

FIG. 10 is a schematic diagram illustrating a semiconductor device D30 (a field effect transistor according to at least one embodiment. Referring to FIG. 10, the semiconductor device D30 may further include a second dielectric layer 400 between the channel 110 (and/or 111) and the first dielectric layer 200. The first dielectric layer 200 may refer to the above-described feature.

The second dielectric layer 400 may suppress or prevent electrical leakage. The thickness of the second dielectric layer 400 may be 0.1 nm or more, 0.3 nm or more, and/or 0.5 nm or more, and/or may be 5 nm or less, 4 nm or less, 3 nm or less, 2 nm or less, and/or 1 nm or less. The second dielectric layer 400 may include a paraelectric material and/or a high-k dielectric material, and may include at least one of silicon oxide, silicon nitride, aluminum oxide, hafnium oxide, zirconium oxide, a two-dimensional (2D) insulator (such as hexagonal boron nitride (h-BN)), and/or the like. For example, the second dielectric layer 400 may include silicon oxide ($SiO_2$), silicon nitride (SiNx), and/or the like. Further, the second dielectric layer 400 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrSiO_4$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), and/or the like. In addition, the second dielectric layer (400) may include metal oxynitride such as aluminum oxynitride (AlON), zirconium oxynitride (ZrON), hafnium oxynitride (HfON), lanthanum oxynitride (LaON), yttrium oxynitride (YON), silicate (such as ZrSiON, HfSiON, YSiON, LaSiON, and/or the like), aluminate (such as ZrAlON, HfAlON, and/or the like), and/or the like.

Referring to FIG. 10, the semiconductor device D30 may further include a conductive layer 500 between the channel 110 and the first dielectric layer 200. The conductive layer 500 may have a conductivity of, for example, about 1 Mohm/square or less. The conductive layer 500 may be a floating electrode, and may be formed of a metal and/or a metal compound.

The field effect transistor may be implemented in various forms such as 2-dimension and 3-dimension. For example, the field effect transistor may be in the form of a 1-gate on channel such as a planar-FET, a 3-gate on channel such as a Fin-FET, and/or a 4-gate on channel such as a gate-all-round-FET.

Figure 11:
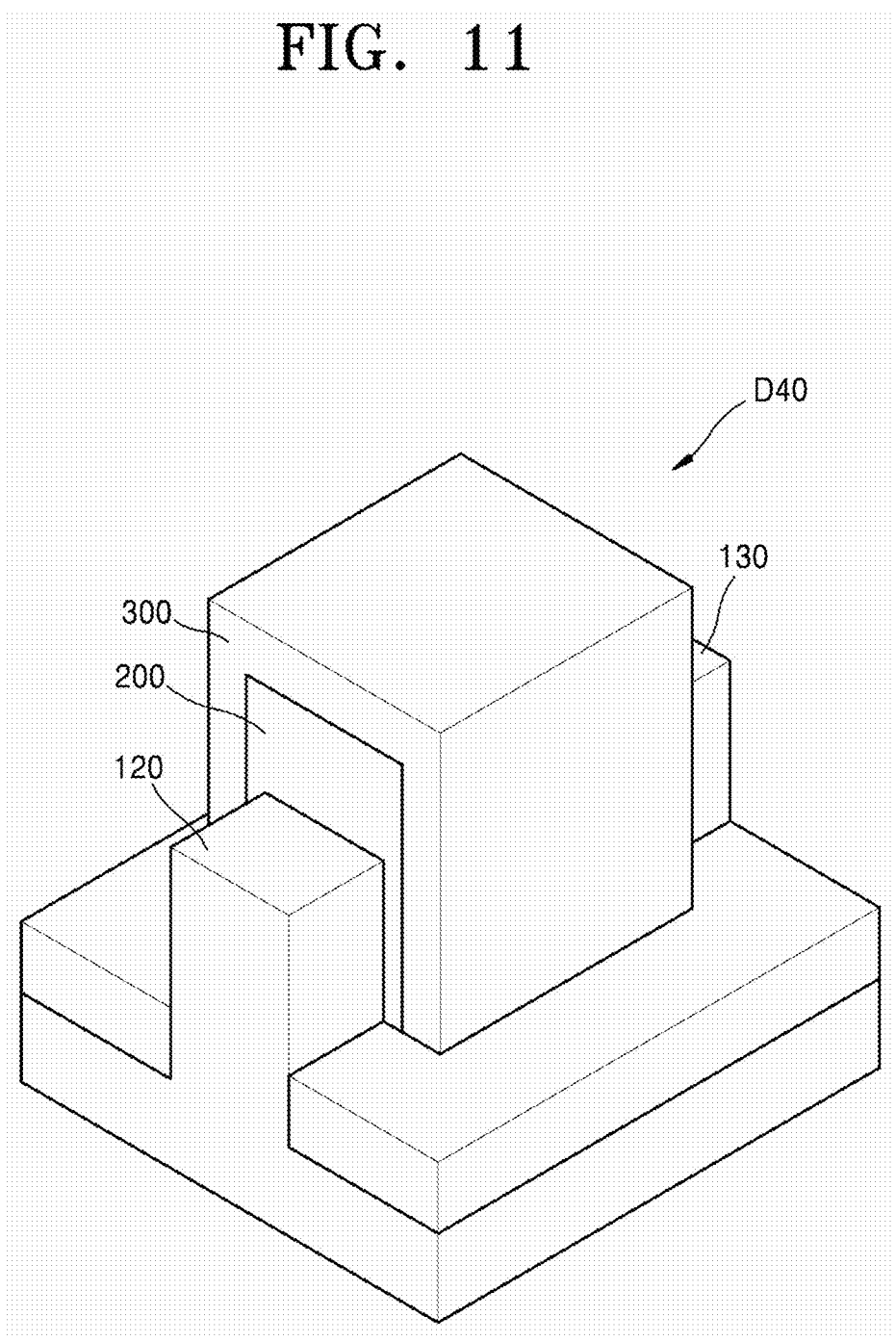
FIG. 11 is a schematic view illustrating a Fin-FET according to at least one example embodiment.

FIG. 11 is a schematic diagram illustrating a semiconductor device (specifically, a Fin-FET) according to at least one embodiment. Referring to FIG. 11, the Fin-FET D40 may include a source 120, a drain 130, and a channel 110 of FIG. 8 or 111 of FIG. 9 defined as a region therebetween, and the channels 110 and 111 may have a fin shape. The gate electrode 300 may be arranged to cross a fin shape on the substrate 100 including the fin shape. The channel 110 or 111 may be formed in a region where the fin shape and the gate electrode 300 intersect. The dielectric layer 200 may be arranged between the channel 110 or 111 and the gate electrode 300 to surround the channel 110 and/or 111.

Figure 12:
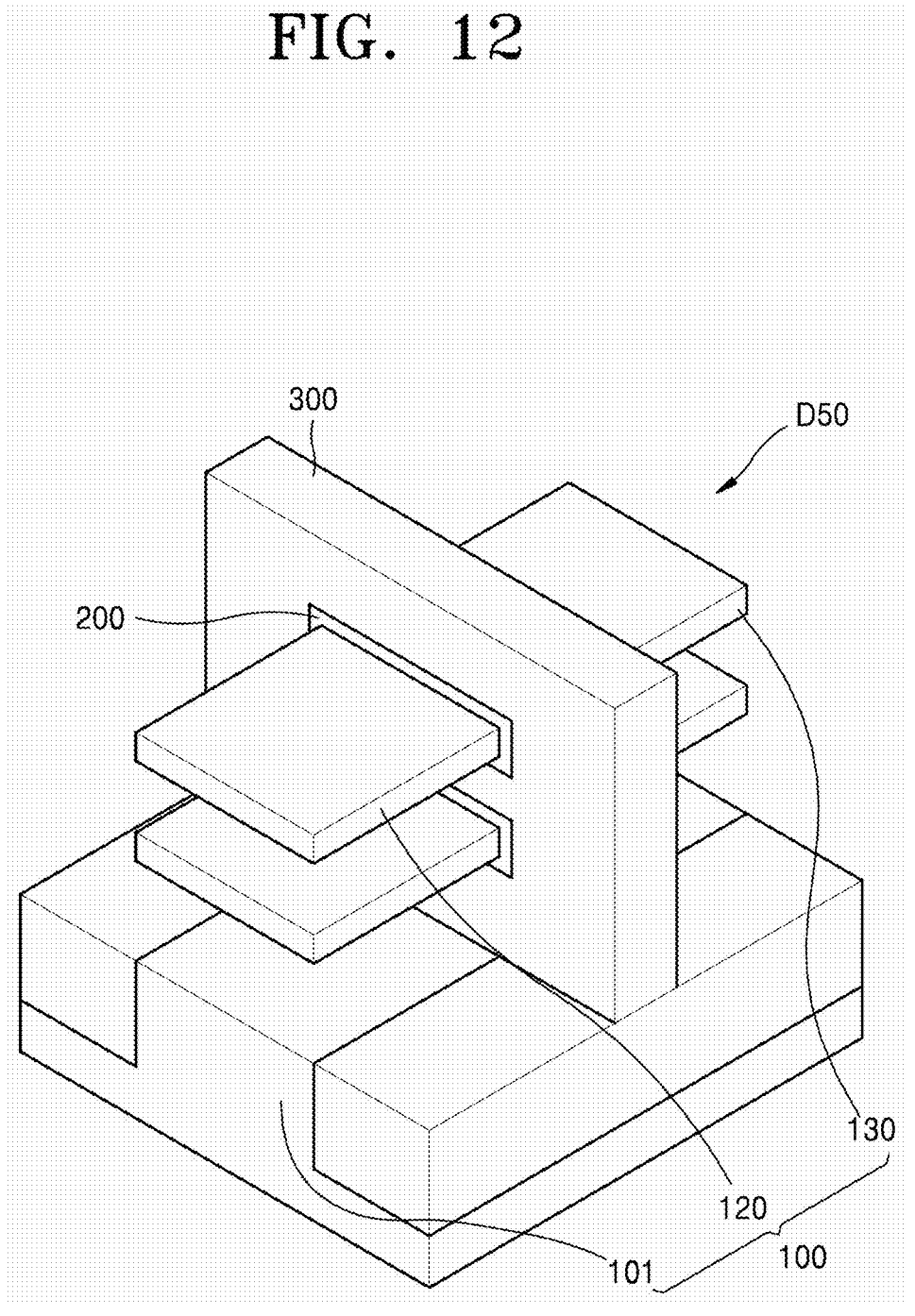
FIG. 12 is a schematic view illustrating a gate-all-around-FET according to at least one example embodiment.

FIG. 12 is a schematic diagram illustrating a semiconductor device (specifically, a gate-all-around-FET) according to at least one embodiment. Referring to FIG. 12, the gate-all-round-FET D50 may include a source 120, a drain 130, and a channel 110 in FIG. 8 or 111 in FIG. 9 defined as a region therebetween, and the channels 110 and 111 may be in the form of a wire, a sheet, or the like. The source 120, the drain 130, and the channels 110 and 111 may be arranged to be spaced apart from the substrate region 101. The gate electrode 300 may be arranged to cross the source 120, the drain 130, and the channel 110 or 111 to surround the source 120, the drain 130, and the channel 110 or 111. The channel 110 or 111 may be formed in a region surrounded by the gate electrode 300. Specifically, the dielectric layer 200 may be arranged between the channel 110 or 111 and the gate electrode 300 to surround the channel 110 or 111.

Figure 13:
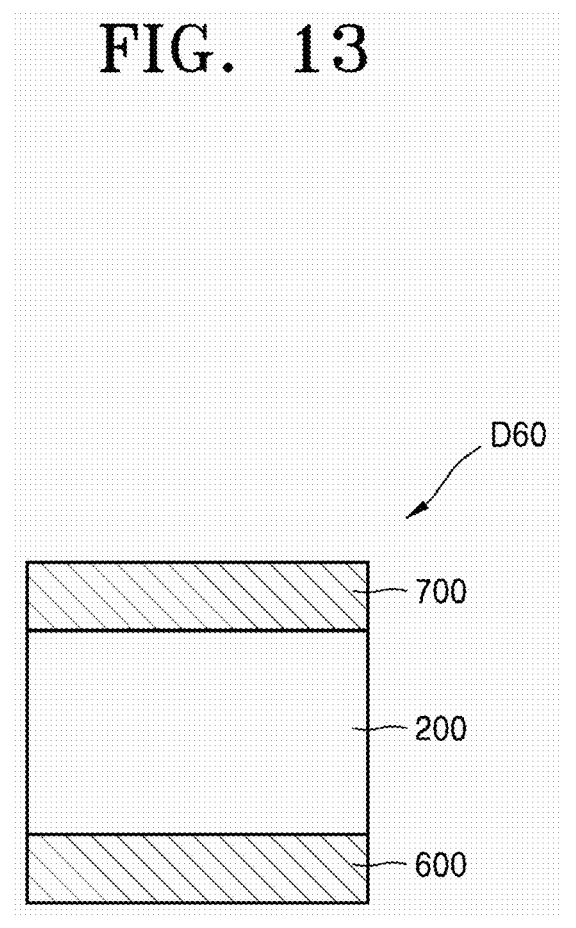

FIG. 13 is a schematic diagram illustrating a capacitor according to at least one embodiment.

Referring to FIG. 13, a capacitor D60 may include a first electrode 600, a second electrode 700, and the dielectric layer 200 as described above.

The first and second electrodes 600 and 700 may be and/or include a conductive material. The conductive material may include, for example, at least one of a metal, a conductive metal oxide, a conductive metal nitride, a conductive metal carbide, polysilicon, a combination thereof, and/or the like. In some example embodiments the dielectric layer 200 may be formed on the first electrode 600.

Figure 14:
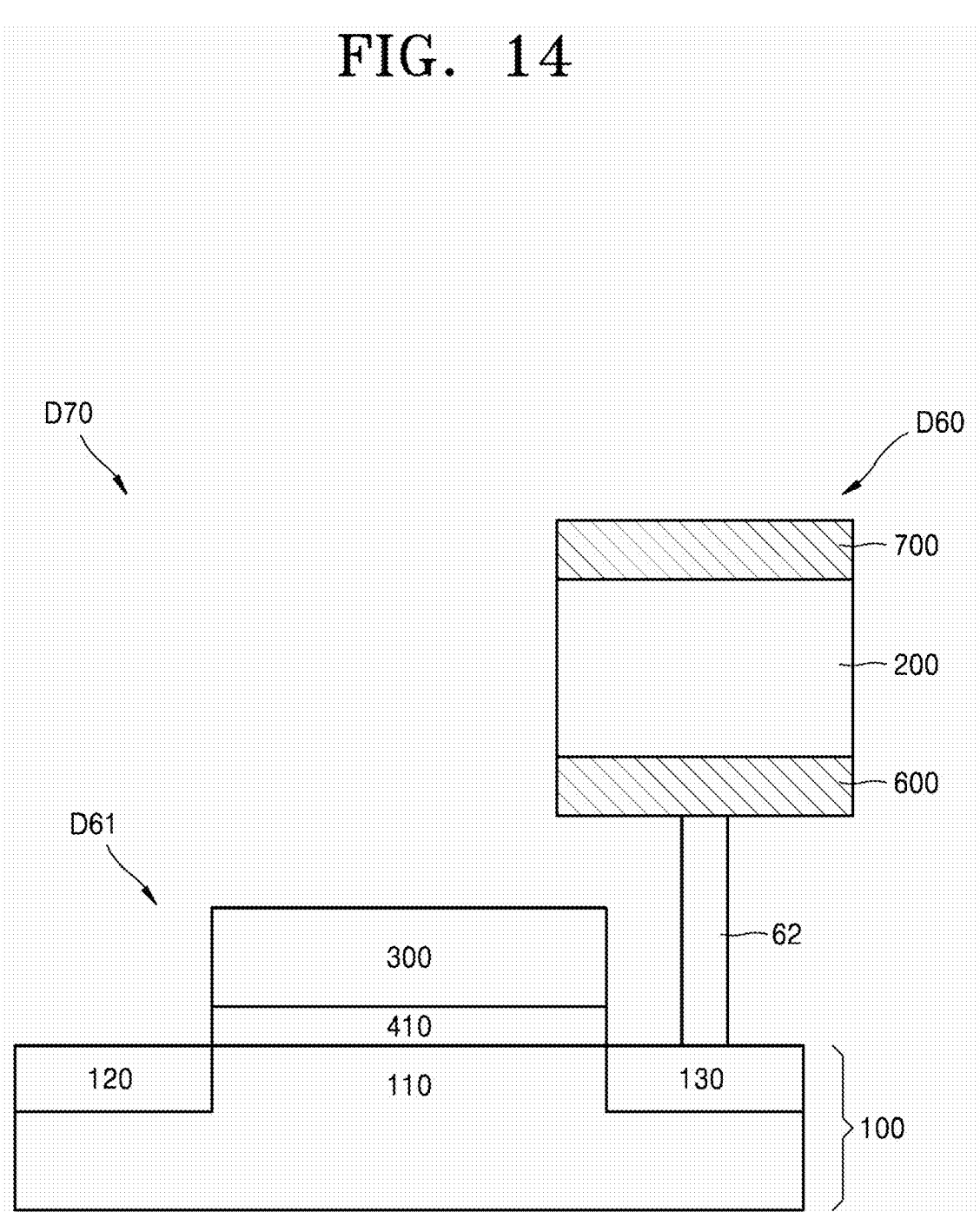
FIG. 14 is a schematic diagram illustrating a semiconductor device (a connection structure between a capacitor and a field-effect transistor) according to at least one example embodiment.

FIG. 14 is a schematic diagram illustrating a semiconductor device (a connection structure between a capacitor and a field effect transistor) according to an embodiment.

Referring to FIG. 14, a semiconductor device D70 may include a capacitor D60 and a transistor D61. The transistor D61 may include a first source/drain region 120, a second source/drain region 130, a dielectric layer 410, a channel 110 region, and a gate dielectric 300. The capacitor D60 may include a first electrode 600, a second electrode 700, and a dielectric layer 200 therebetween. A connection structure 62 may electrically connect an electrode of the capacitor D60 with a source/drain region of the transistor D61. The connection structure 62 may be and/or include a conductive material, but the example embodiments are not limited thereto. For example, in some example embodiments the capacitor and the transistor may be directly connected.

In some example embodiments, the transistor D61 may be substantially the same as the transistor D10 of FIG. 8 (and/or D20 of FIG. 9, D30 of FIG. 10, D40 of FIG. 11, and/or D50 of FIG. 12).

In some example embodiments, the semiconductor device D70 may be referred to as a memory cell and may be included in an array (e.g., a memory array).

Figure 15:
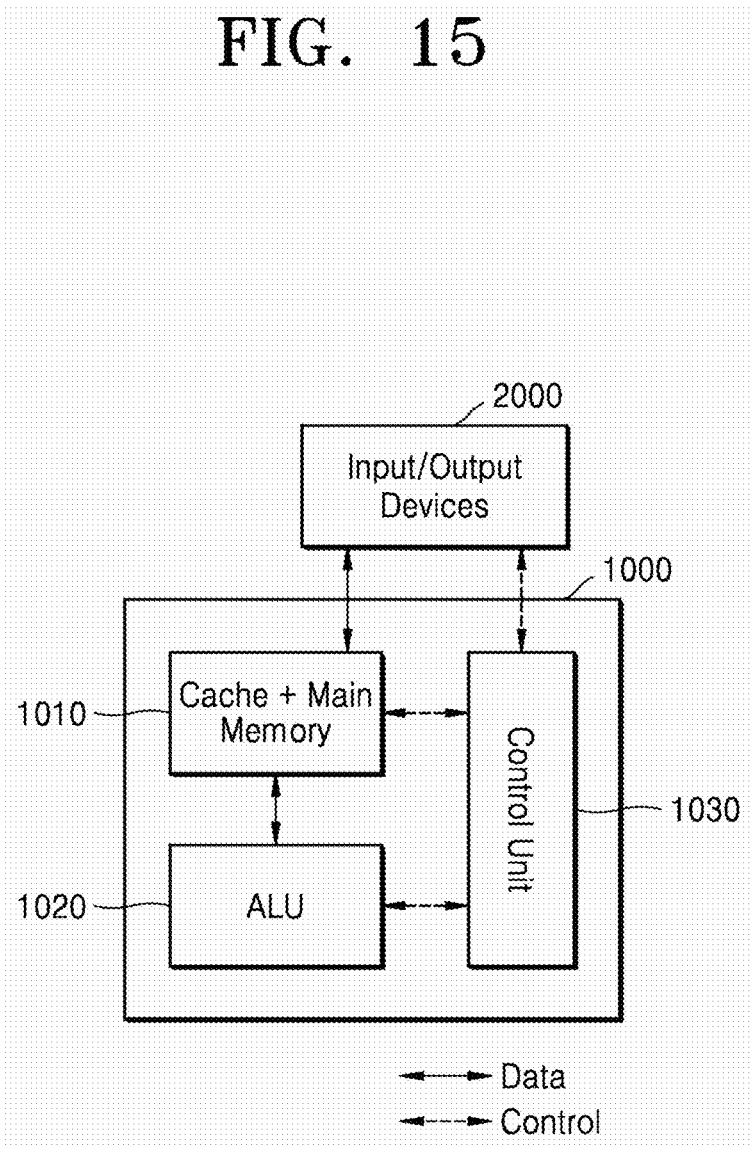
FIG. 15 is a conceptual diagram schematically illustrating an electronic element architecture applicable to an electronic device, according to at least one example embodiment.
Figure 16:
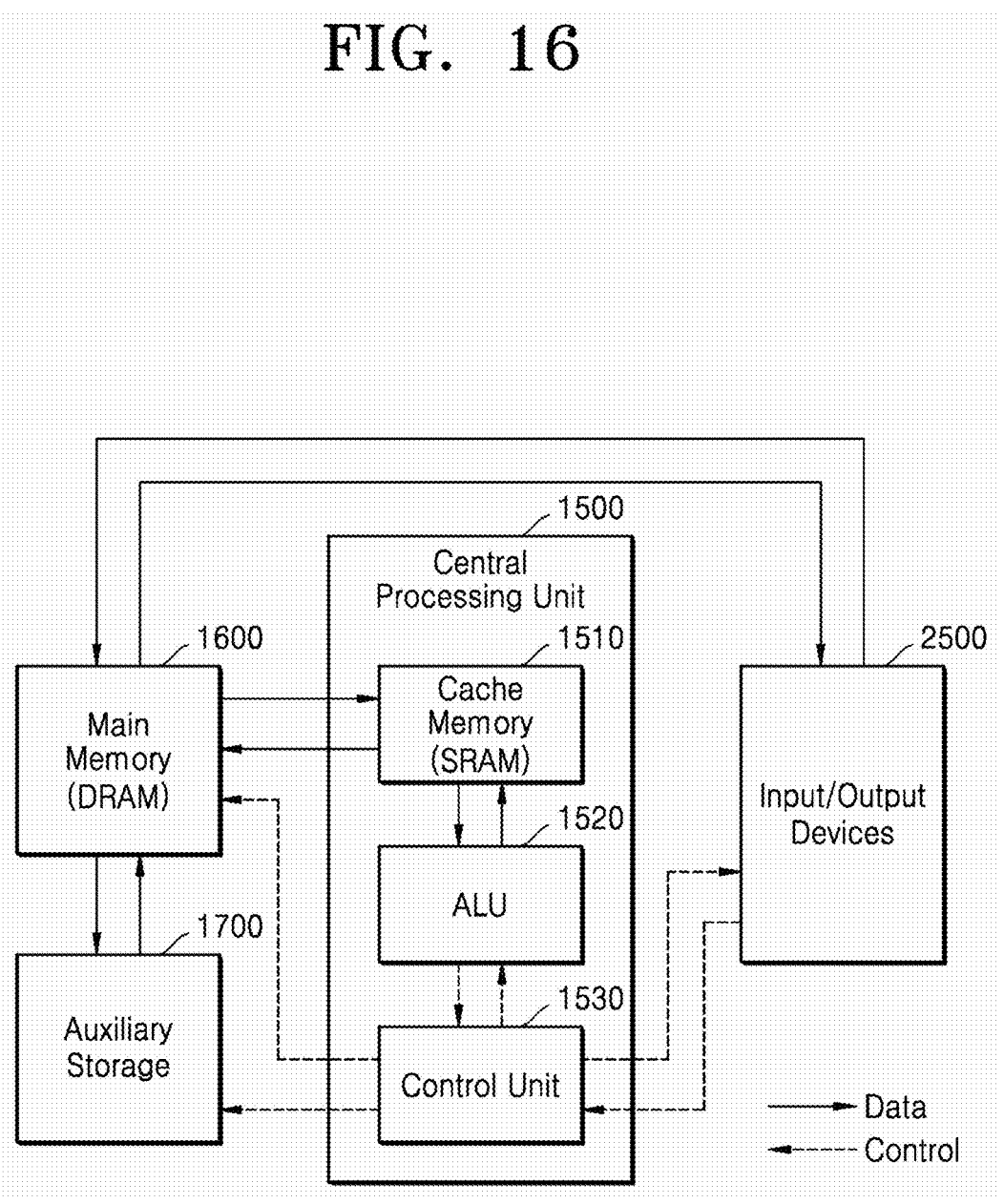
FIG. 16 is a conceptual diagram schematically illustrating an electronic element architecture applicable to an electronic device, according to at least one example embodiment.

FIGS. 15 and 16 are conceptual diagrams schematically illustrating an electronic element architecture applicable to an electronic device according to some example embodiments.

Referring to FIG. 15, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030. In some example embodiments, the memory unit 1010, the ALU module 1020, and the control unit 1030 may be connected to each other by a metal line in an on-chip and directly communicate with each other. The memory unit 1010, the ALU module 1020, and the control unit 1030 may be integrated monolithically on one substrate to constitute one chip. An input/output element 2000 may be connected to the electronic device architecture (chip) 1000.

Each of the memory unit 1010, the ALU 1020, and the control unit 1030 may independently include the semiconductor device (the field effect transistor and/or the capacitor) described above. For example, the ALU 1020 and the control unit 1030 may each independently include the field effect transistor described above, and the memory unit 1010 may include the capacitor, the field effect transistor, or a combination thereof, which have been described above. The memory unit 1010 may include both a main memory and a cache memory. The electronic device architecture (chip) 1000 may be an on-chip memory processing unit.

Referring to FIG. 16, a cache memory 1510, an ALU 1520, and a control unit 1530 may configure a central processing unit (CPU) 1500. The cache memory 1510 may include a static random access memory (SRAM), and may include the field effect transistor described above. Separately from the CPU 1500, a main memory 1600 and an auxiliary storage 1700 may be provided. Each of the central processing unit 1500, the main memory 1600 and/or the auxiliary storage 1700 may independently include the semiconductor device (the field effect transistor and/or the capacitor) described above. For example, the ALU 1520 and the control unit 1530 may each independently include the field effect transistor described above, and the SRAM 1510 may include the capacitor, the field effect transistor, or a combination thereof, which have been described above. Similarly, the main memory 1600 may include a dynamic random access memory (DRAM) and may include the capacitor described above. The semiconductor device may also be referred to as an electronic device.

In some cases, an electronic device architecture may be implemented in a form in which computing unit devices and memory unit devices are adjacent to each other in one chip, regardless of distinction of sub-units.

The dielectric layer of this disclosure includes an orthorhombic crystal structure of an oIV phase (space group: Pmn21), and thus may have a low polarization switching energy barrier.

The dielectric layer includes crystals in which the <11x> (0≤x≤1) crystal direction is arranged in the out-of-plane direction while having an orthorhombic crystal structure of an oIV phase (space group: Pmn21) and thus may have a high polarization value.

The semiconductor device including the dielectric layer having the above-described characteristics may have improved operational reliability.

Although example embodiments of the thin-film structure and the semiconductor device including the same have been described as above, it should be understood that the embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin-film structure comprising:
a base layer; and
a dielectric layer on the base layer, the dielectric layer including crystals including a <11x> (0≤x≤1) crystal orientation in an out-of-plane direction of the base layer and having an orthorhombic crystal structure of an oIV phase (space group: Pmn21).

2. The thin-film structure of claim 1, wherein the dielectric layer comprises a ferroelectric material.

3. The thin-film structure of claim 1, wherein the dielectric layer comprises at least one of hafnium oxide or hafnium-zirconium oxide.

4. The thin-film structure of claim 1, wherein an angle between the <11x> (0≤x≤1) crystal orientation and the out-of-plane direction is about 35° or less.

5. The thin-film structure of claim 1, wherein the crystals including the <11x> (0≤x≤1) crystal orientation constitute about 10% or more of all crystals in the dielectric layer.

6. The thin-film structure of claim 5, wherein the crystals including the <11x> (0≤x≤1) crystal orientation are dominant among all crystals in the dielectric layer.

7. The thin-film structure of claim 5, wherein the crystals including a <111> crystal orientation are dominant among all crystals in the dielectric layer.

8. The thin-film structure of claim 1, wherein a thickness of the dielectric layer is about 0.1 nm or more and about 20 nm or less.

9. The thin-film structure of claim 8, wherein the thickness of the dielectric layer is about 5 nm or less.

10. The thin-film structure of claim 1, wherein the dielectric layer is doped with a dopant including at least one of Zr, La, Y, Gd, Si, or Al.

11. The thin-film structure of claim 1, wherein an effective polarization of the dielectric layer in the out-of-plane direction is about 25 $\mu$C/cm$^2$ or more and about 50 $\mu$C/cm$^2$ or less.

12. The thin-film structure of claim 1, wherein the crystals including the <11x> (0≤x≤1) crystal orientation and the orthorhombic crystal structure of the oIV phase (space group: Pmn21) are dominant among all crystals in the dielectric layer.

13. An electronic device comprising the thin-film structure of claim 1.

14. The electronic device of claim 13, comprising:

a first electrode;

a second electrode spaced apart from the first electrode; and the dielectric layer between the first electrode and the second electrode, wherein one of the first electrode or the second electrode is the base layer.

15. The electronic device of claim 14, further comprising:

a paraelectric layer between the first electrode and the second electrode.

16. The electronic device of claim 15, wherein the paraelectric layer is between the dielectric layer and the base layer.

17. The electronic device of claim 16, wherein the paraelectric layer comprises at least one of aluminum oxide (Al2O3), lanthanum oxide (La2O3), yttrium oxide (Y2O3), or silicon oxide (SiO2).

18. The electronic device of claim 14, wherein at least one of the first electrode or the second electrode comprises a semiconductor material.

19. The electronic device of claim 18, wherein the electrode including the semiconductor material comprises a source and a drain.

20. A semiconductor apparatus comprising the electronic device of claim 13.

* * * * *